United States Patent [19]

Boldridge, Jr.

[11] 4,204,115
[45] May 20, 1980

[54] REMOVABLY ATTACHABLE WATT-HOUR METER MONITOR DEVICE

[75] Inventor: Austin G. Boldridge, Jr., Freehold, N.J.

[73] Assignee: Conversational Systems, Inc., New York, N.Y.

[21] Appl. No.: 891,789

[22] Filed: Mar. 30, 1978

[51] Int. Cl.² ............................ G01D 5/34; G02B 5/16
[52] U.S. Cl. ........................... 250/227; 250/231 SE; 324/175; 340/201 P
[58] Field of Search ............... 250/216, 231 SE, 227, 250/551, 570, 231 GY; 324/175; 340/189 R, 190, 201 P; 350/175 SL

[56] References Cited

U.S. PATENT DOCUMENTS

| 1,878,658 | 9/1932 | Aronoff | 324/175 X |
| 2,566,868 | 9/1951 | Allia | 324/175 X |
| 3,950,075 | 4/1976 | Cook et al. | 350/175 SL X |

FOREIGN PATENT DOCUMENTS 1257359 12/1971 United Kingdom .......... 350/175 SL X

OTHER PUBLICATIONS

"Electronic Tachometer", Electronic Industries, Mar. 1945, vol. 4, No. 3, pp. 80, 81 and 208.

*Primary Examiner*—David C. Nelms
*Assistant Examiner*—Edward P. Westin
*Attorney, Agent, or Firm*—Hane, Roberts Spiecens & Cohen

[57] ABSTRACT

Affixed to or positioned opposite the glass housing of a watt-hour meter which has a rotating disc with an indicator mark on its periphery is a device for indicating the rate of rotation of the disc. The device has two spherical lenses disposed generally in the plane of the disc along a line which is generally perpendicular to a radius of the disc and preferably symmetrically positioned on opposite sides of the radius. A first fibre optical cable couples visible light from an incandescent source to the first spherical lens to focus light on the periphery of the disc and a second fibre optical cable couples visible light collected by the second spherical lens focused on the periphery of the disc to a photoresistor.

4 Claims, 5 Drawing Figures

REMOVABLY ATTACHABLE WATT-HOUR METER MONITOR DEVICE

BACKGROUND OF THE INVENTION

This invention pertains to optical sensors and more particularly to such sensors for the remote measurement of power consumption.

In the course of mechanizing electrical energy conservation programs, it is essential that a low cost method be available for measuring power consumption accurately on existing power installations. Further it is desirable that measured power consumption, by whatever means employed be essentially of the same accuracy as provided by the utility company's watt-hour-meters in order to avoid conflict as to measurement accuracy. Additionally, it is desirable for safety reasons that any auxiliary power measurement device be simple to install by non-technical personnel. The prime power sensor should ideally be non-metallic to prevent the possibility of electrical shock to the installer and to preclude any fringe magnetic perturbations to any watt-hour-meter to which the sensor may be closely installed. Finally the installation of any auxiliary power sensor must not interfere with the meter reader's visability to the meter face, disc or digital readouts, and the installation must not interfere with removal on replacement of an existing watt-hour-meter.

SUMMARY OF THE INVENTION

Briefly, the invention contemplates apparatus for indicating the rotations of a circular disc having an indicator mark on its periphery and within a transparent enclosure. The apparatus contemplates first and second spherical lenses disposed generally in the plane of the disc and along a line which is generally perpendicular to a line extending outward from the axis of rotation of the disc and outside the enclosure with the lenses generally symmetrically disposed on opposite sides of the outwardly extending line. A source of visible light is focused by one of the spherical lenses onto the periphery of the disc and the light reflected therefrom is focused by the other spherical lens.

BRIEF DESCRIPTION OF THE DRAWING

Other objects, the features and advantages of the invention will be apparent from the following detailed description when read with the accompanying drawing which shows the presently preferred embodiment of the invention. In the drawing.

DESCRIPTION OF THE PREFERRED EMBODIMENT

Figure 1:
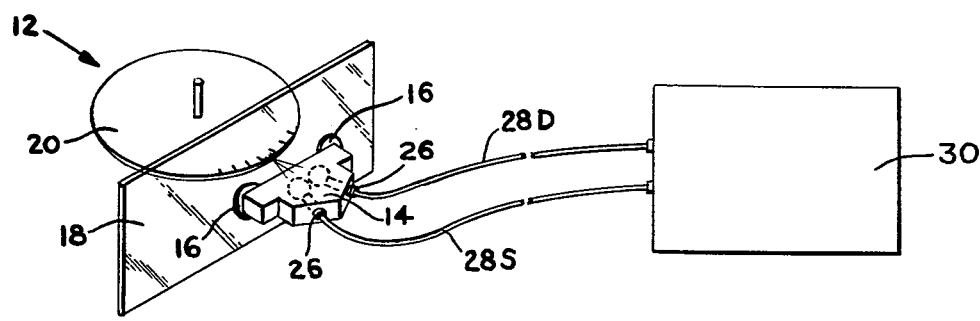
FIG. 1 is a perspective view of a preferred embodiment of the invention affixed to the transparent enclosure of a watt-hour-meter.
Figure 2:
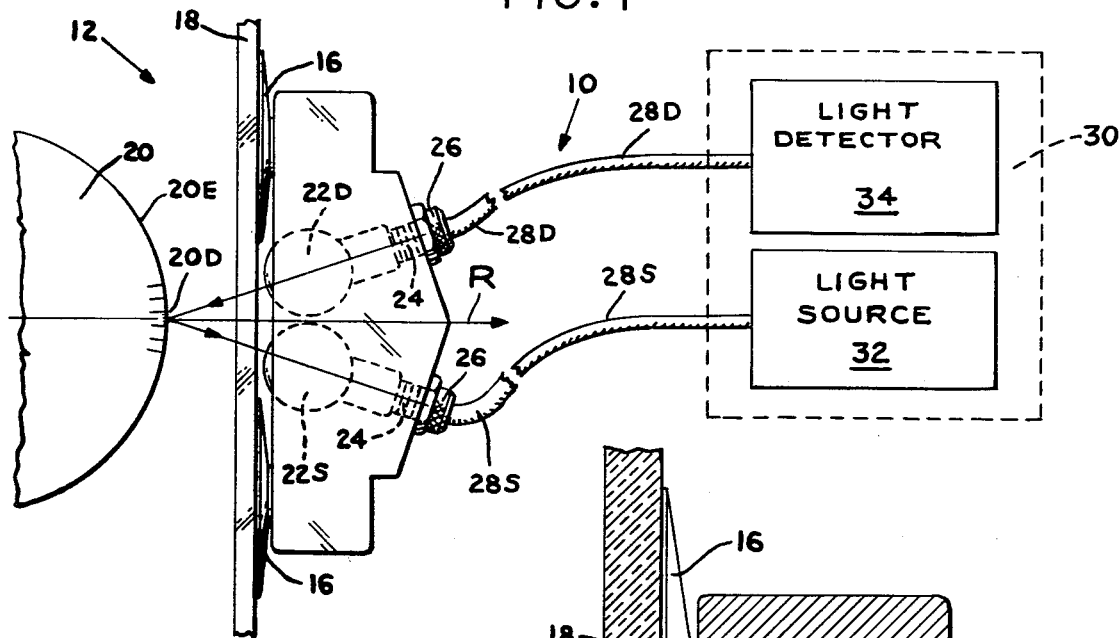
FIG. 2 is a top view of the indicating apparatus of the invention positioned opposite the disc of a watt-hour-meter.
Figure 3:
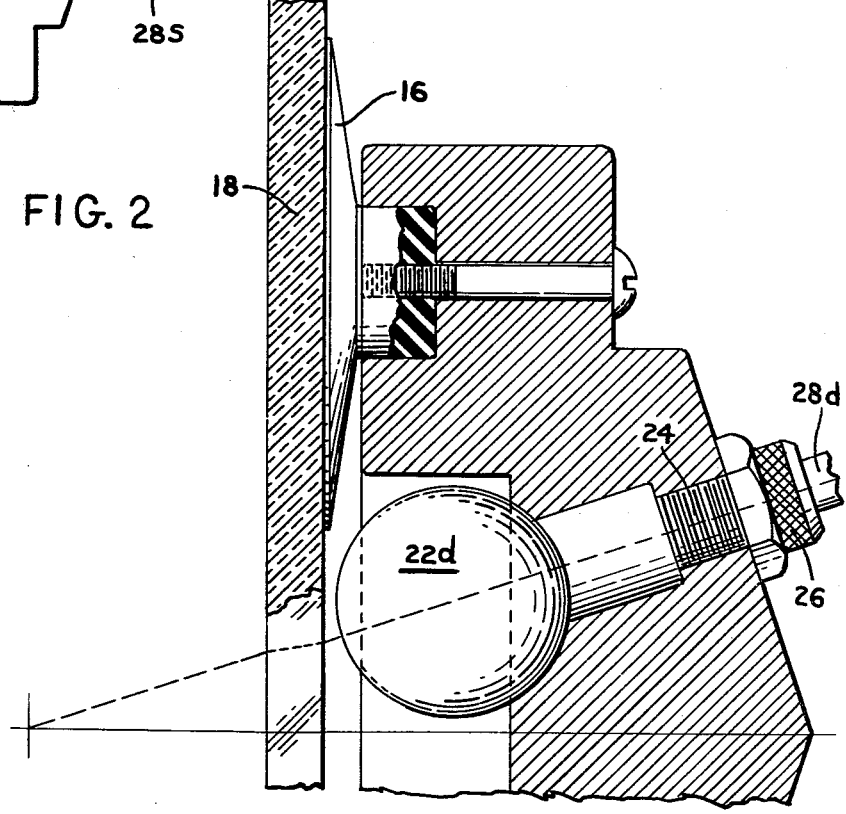
FIG. 3 is an enlarged plan view of the optical housing of the apparatus of FIG. 3.

In FIGS. 1 and 2 the indicating apparatus 10 according to the invention is shown positioned against a conventional watt-hour-meter 12. In this particular embodiment the optical housing 14 of the apparatus 10 is fixed via suction cups 16 to the glass enclosure 18 opposite the peripheral edge 20E of disc 20 to monitor the darkened region 20D of the edge 20E. As is well known, when electrical energy is being drawn the disc rotates and the darkened spot which is required by law on the disc of each meter periodically moves past a region of observation.

More specifically within the optical housing are mounted two identical spherical lenses 22 preferable made of acrylic plastic. When the optical housing 14 is properly positioned the lenses 22 are in the plane of the disc 20. It should be noted that because spherical lenses are employed it is only necessary that the lenses be generally in such plane and precise alignment is not required. Furthermore, the housing is positioned such that the lenses are on a line which is generally perpendicular to a fixed line R extending outward from the axis of rotation of the disc 20 to the enclosure 18 with the lenses being generally symmetrically disposed on opposite sides of the line R.

The optical housing 14 has two hollow screw thread optical terminals 24 positioned along radius vectors of the respective lenses 22 for accepting the furrules 26 terminating respective fibre-optic cables 28. Preferably, each cable is a 64-element CROFON cable made by DUPONT. The other ends of the cable 28 are terminated in the circuits housing 30. In particular, cable 28S is connected to light source 32 and cable 28D is connected to light detector 34.

In operation, the light from source 32 is emitted from lens 22S. The operator visually aligns the housing 14 so that the light impinges on the edge 20E and that the plane of the housing 14 is generally parallel to the disc 20 with the lenses straddling line R. It can be desirable to provide the top of the housing 14 with a guide line. It should be recalled that by using spherical lenses, considerably misaligned still results in a working system.

After such alignment is made, the light from lens 22S is reflected by the edge 20D to lens 22D. Periodically, (once a revolution of disc 20) this constant receptional of the light is interrupted by the non-reflecting darkened region 20D. Thus once a revolution of disc 20 light detector 34 is momentarily turned off. Each turn off can result in the generation of a pulse signal. By counting pulse signals and known the constant of the watt-hour meter and indication of electrical consumption can be obtained.

Figure 4:
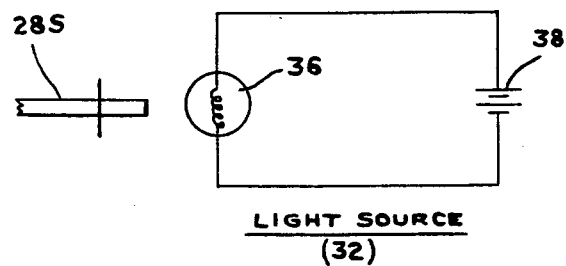
FIG. 4 is a schematic of the light source of the apparatus of FIG. 2.

In FIG. 4 the light source 32 is shown wherein the other end of cable 28S is positioned opposite, preferably, an incandescent lamp 36 which is energized by battery 38. The lamp can be a type CM20-3 requiring 0.3 amperes at 2.5 volts.

Figure 5:
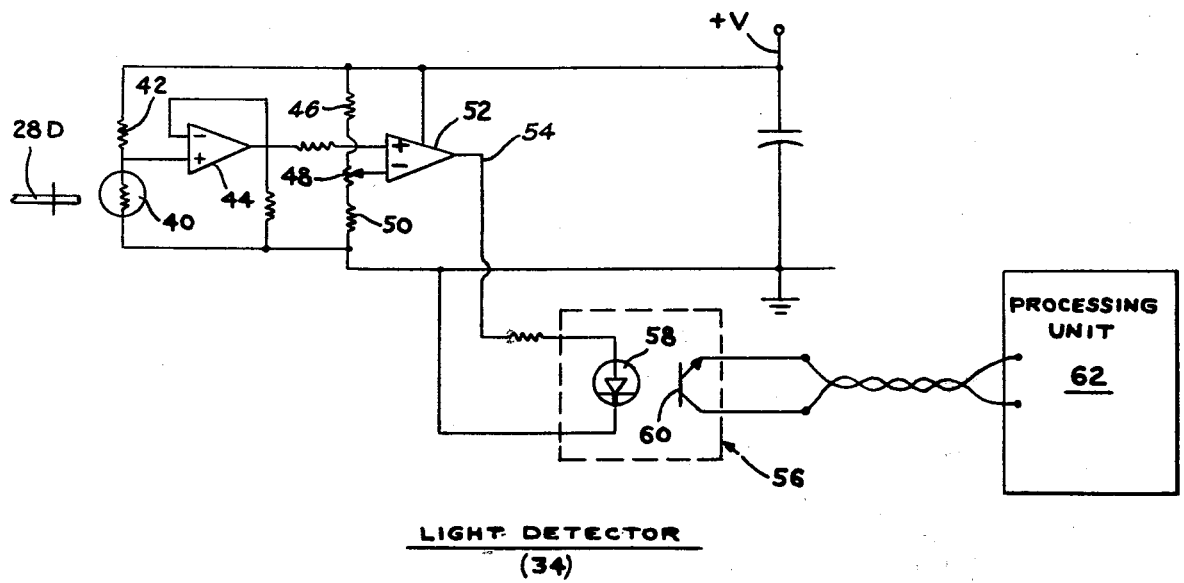
FIG. 5 is a schematic of the light detectors of the apparatus of FIG. 2.

The light detector 34 is shown in FIG. 5 with the other end of cable 28D positioned opposite a photoresistor 40, preferably a cadmium sulfide cell such as a CL909 made by Clairex. The photoresistor 40 is connected in series with a resistor 42 to form a potential divider between source $+V$ and ground. The junction of the resistor is connected to an input of operational amplifier 44 connected as a voltage follower amplifier. The output of the amplifier 44 is connected to one input of operational amplifier 52 acting as a difference amplifier. The other input is connected to a reference voltage established by means of the resistor 46, the potentiometer 48 and the resistor 50 connected in series between source $+V$ and ground.

The amplifiers are so phased that under low light conditions the output 54 of amplifier 52 is high. Thus a pulse is emitted whenever the darkened region 20D of the disc is sensed. Note, amplifier 52 binarily switches between high and low levels in accordance with the relative amplitudes of the reference voltages and the output signal of amplifier 44. Thus potentiometer 48 acts as a light level sensitivity control.

The output 54 of the amplifier 44 is connected to the opto-isolator 56. In particular the light emitting diode 58 of the isolator is connected across the output 54 and ground and emits a pulse of light whenever the output goes high. Disposed opposite the diode 58 is the phototransistor 60 which conducts whenever the diode emits light. The transistor 60 is connected to a processing unit 62 which converts the pulses to electrical consumption.

In order to obtain high efficiency the system operates in the visible light region and attenuates the infra-red radiation. The fibre-optic cables and the spherical lens are specifically chosen to have band pass characteristics in the visible spectrum.

What is claimed is:

1. Apparatus for indicating the rotation of a disc having an indicator mark on its periphery, said disc being positioned within a transparent enclosure, said apparatus comprising a housing, said housing having a centerline and an opening in the region of said centerline, first and second spherical lenses, means for positioning within said housing said spherical lens symmetrically on opposite sides of said centerline with first portions thereof facing said opening, first and second fibre optical cables extending into said housing, each of said cables being positioned adjacent second portions of said first and second spherical lenses, respectively, said second portions being on diameters of the respective spherical lenses and opposite said first portions, a light source external to said housing and positioned adjacent the end of said first optical cable remote from said first spherical lens, a light detector external to said housing and positioned adjacent the end of said second optical cable remote from said second spherical lens, and attaching means for removably attaching said housing to said transparent enclosure with the plane of said spherical lenses in the plane of said disc and said opening of said housing facing said disc.

2. The apparatus of claim 1 wherein said attaching means comprises suction cup means.

3. The apparatus of claim 2 wherein said light source is an incandescent lamp and said light detector is a photodiode.

4. The apparatus of claim 3 wherein said spherical lenses are made of plastic.

* * * * *